(12) United States Patent
Rengarajan et al.

(10) Patent No.: US 9,228,274 B2
(45) Date of Patent: Jan. 5, 2016

(54) AXIAL GRADIENT TRANSPORT GROWTH PROCESS AND APPARATUS UTILIZING RESISTIVE HEATING

(75) Inventors: Varatharajan Rengarajan, Pine Brook, NJ (US); Bryan K. Brouhard, Budd Lake, NJ (US); Michael C. Nolan, Andover, NJ (US); Ilya Zwieback, Washington Township, NJ (US)

(73) Assignee: II-VI Incorporated, Saxonburg, PA (US)

( * ) Notice: Subject to any disclaimer, the term of this patent is extended or adjusted under 35 U.S.C. 154(b) by 1357 days.

(21) Appl. No.: 12/632,906

(22) Filed: Dec. 8, 2009

(65) Prior Publication Data

US 2010/0139552 A1   Jun. 10, 2010

Related U.S. Application Data

(60) Provisional application No. 61/120,556, filed on Dec. 8, 2008.

(51) Int. Cl.
*C30B 23/06* (2006.01)
*C30B 29/36* (2006.01)

(52) U.S. Cl.
CPC .................. *C30B 29/36* (2013.01); *C30B 23/06* (2013.01)

(58) Field of Classification Search
CPC .......... C30B 29/36; C30B 23/00; C30B 23/06
USPC ................................ 117/84, 88, 89, 105, 951
See application file for complete search history.

(56) References Cited

U.S. PATENT DOCUMENTS

| 4,866,005 | A | 9/1989 | Davis et al. |
| 5,611,955 | A | 3/1997 | Barrett et al. |
| 5,667,587 | A | 9/1997 | Glass et al. |
| 5,683,507 | A | 11/1997 | Barrett et al. |
| 5,746,827 | A | 5/1998 | Barrett et al. |

(Continued)

FOREIGN PATENT DOCUMENTS

| CN | 85101043 A | 1/1987 |
| CN | 1847468 A | 10/2006 |

(Continued)

OTHER PUBLICATIONS

Ma et al., "Thermal system design and dislocation reduction for growth of wide band gap crystals: application to SiC growth" Journal of Crystal Growth, 2003, pp. 318-330, vol. 258.

(Continued)

*Primary Examiner* — Matthew Song
(74) *Attorney, Agent, or Firm* — The Webb Law Firm

(57) ABSTRACT

A crucible has a first resistance heater is disposed in spaced relation above the top of the crucible and a second resistance heater with a first resistive section disposed in spaced relation beneath the bottom of the crucible and with a second resistive section disposed in spaced relation around the outside of the side of the crucible. The crucible is charged with a seed crystal at the top of an interior of the crucible and a source material in the interior of the crucible in spaced relation between the seed crystal and the bottom of the crucible. Electrical power of a sufficient extent is applied to the first and second resistance heaters to create in the interior of the crucible a temperature gradient of sufficient temperature to cause the source material to sublimate and condense on the seed crystal thereby forming a growing crystal.

7 Claims, 9 Drawing Sheets

(56) References Cited

U.S. PATENT DOCUMENTS

| | | |
|---|---|---|
| 6,800,136 B2 | 10/2004 | Snyder et al. |
| 2002/0096108 A1* | 7/2002 | Kuhn et al. .................. 117/200 |
| 2003/0037724 A1* | 2/2003 | Snyder et al. ................ 117/208 |
| 2006/0213430 A1* | 9/2006 | Jenny et al. .................. 117/109 |
| 2010/0031877 A1* | 2/2010 | Gupta et al. .................. 117/105 |

FOREIGN PATENT DOCUMENTS

| | | |
|---|---|---|
| EP | 1268882 B1 | 5/2011 |
| JP | 03501118 A | 3/1991 |
| JP | 09221397 A | 8/1997 |
| JP | 09263497 A | 10/1997 |
| JP | 10324599 A | 12/1998 |
| JP | 2003095794 A | 4/2003 |
| JP | 2006089376 A | 4/2006 |
| JP | 2008504203 A | 2/2008 |
| JP | 200874662 A | 4/2008 |

OTHER PUBLICATIONS

Selder et al., "Global numerical simulation of heat and mass transfer for SiC bulk crystal growth by PVT" Journal of Crystal Growth, 2000, pp. 333-338, vol. 211.

Burden, J.P., "Elimination of a Glow Discharge in an Induction-Heated Vacuum Furnace", Nature, 1960, pp. 221-222, vol. 188, No. 4746.

Fagel, J.E., "Elimination of a Glow Discharge in an Induction-Heated Vacuum Furnace", Nature, 1961, pp. 212-213, vol. 189, No. 4760.

Tairov, Y. et al., "Investigation of Growth Processes of Ingots of Silicon Carbide Single Crystals", The Journal of Crystal Growth, 1978, pp. 209-212, vol. 43.

\* cited by examiner

| | THERMAL INSULATION | |
| | BOULE HEATER (LOW TEMPERATURE) | |
| THERMAL INSULATION AND/OR GUARD HEATER | SIC BOULE | THERMAL INSULATION AND/OR GUARD HEATER |
| | VAPOR SPACE | |
| | SIC SOURCE MATERIAL | |
| | SOURCE HEATER (HIGH TEMPERATURE) | |
| | THERMAL INSULATION | |

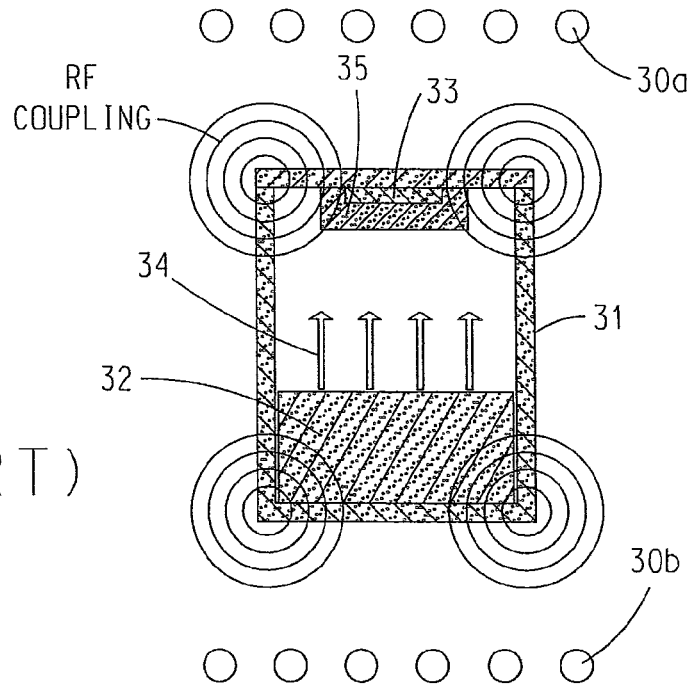
FIG. 3
(PRIOR ART)
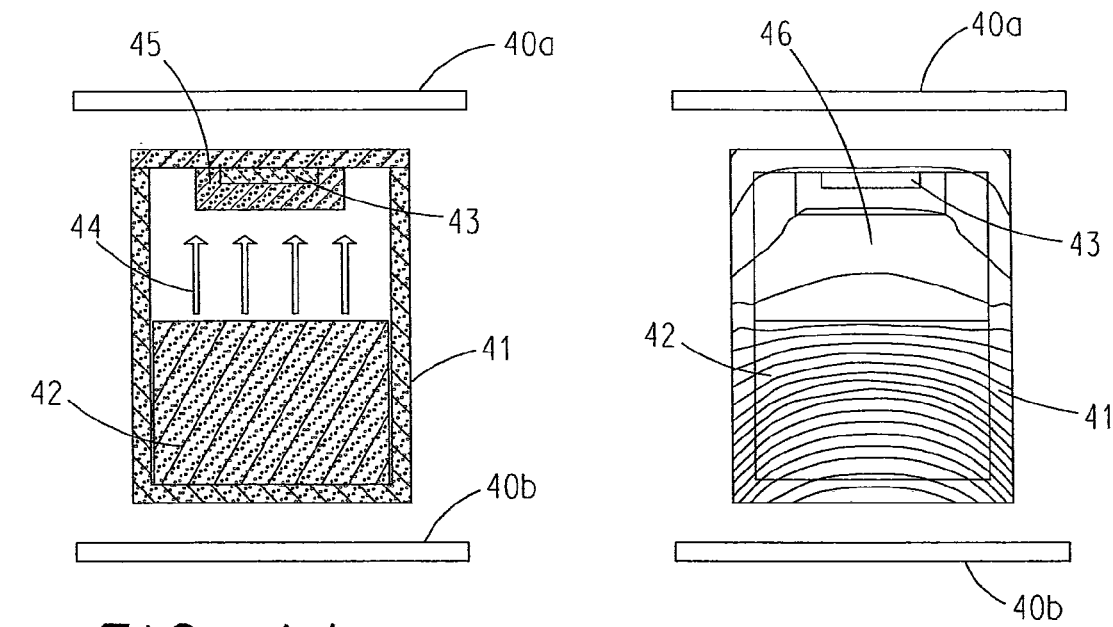
FIG. 4A
(PRIOR ART)
FIG. 4B
(PRIOR ART)

AXIAL GRADIENT TRANSPORT GROWTH PROCESS AND APPARATUS UTILIZING RESISTIVE HEATING

CROSS REFERENCE TO RELATED APPLICATION

This application claims priority from U.S. Provisional Patent Application No. 61/120,556, filed Dec. 8, 2008, entitled "Axial Gradient Transport Growth Process and Apparatus Utilizing Resistive Heating", which is incorporated herein by reference.

BACKGROUND OF THE INVENTION

1. Field of the Invention

The present invention relates to growing industrial-size SiC single crystals by sublimation and, more specifically, to such growth by the technique of Axial Gradient Transport (AGT).

2. Description of Related Art

Wafers of silicon carbide of hexagonal 4H and 6H polytypes serve as lattice-matched substrates to grow epitaxial layers of SiC and GaN, which are used for the fabrication of SiC- and GaN-based semiconductor devices utilized in power and microwave electronic applications.

Large SiC single crystals are grown conventionally by sublimation using the technique of Physical Vapor Transport (PVT). A schematic diagram of a common PVT arrangement is shown in FIG. 1. PVT growth is carried out in vertical crucible 11, which is generally made of graphite. Sublimation source material 13 is disposed at the bottom of the crucible, while a growing crystal (or boule) 15 grows on a seed crystal 14 disposed at the crucible top, for instance, attached to the interior of the crucible lid 12. Most commonly, inductive heating with a single RF coil is utilized for PVT growth. This heating arrangement is shown in FIG. 1 which includes a cylindrical RF coil 19 positioned coaxially with growth crucible 11.

PVT growth is carried out at temperatures generally between 2000° C. and 2400° C. In order to control the vapor transport rate, PVT growth is carried out under a small pressure of inert gas (e.g., helium and/or argon), generally between 1 Torr and 100 Torr.

At these temperatures and pressures, source material 13 vaporizes and fills the interior of crucible 11 with volatile molecular species, such as Si, $Si_2C$ and $SiC_2$. During the growth of growing crystal 15 on seed crystal 14, the temperature of source material 13 is maintained higher than that of the seed crystal 14, typically by 10 to 200° C. This temperature difference forces the vapors to migrate and condense on seed crystal 14 causing the growth of growing crystal 15.

The quality of PVT-grown SiC crystals depends on growth conditions, such as the sign and value of radial temperature gradients in the upper part of crucible 11 where the growth of growing crystal 15 occurs. Strong temperature gradients in growing crystal 15, especially radial ones, cause thermoelastic stress and the generation of defects and cracking in growing crystal 15.

It is known in the art of SiC sublimation growth that the crystal growth interface closely follows the shape of isotherms in the crystal and its vicinity. Positive radial gradients (where the temperature inside of the growth crucible increases in the radial direction from the crucible axis toward the crucible wall) produce a convex (toward source material 13) growth interface. Negative radial gradients (where the temperature decreases in the radial direction from the crucible axis toward the crucible wall) produce a concave (toward source material 13) growth interface. Zero radial gradient (where the temperature does not change in the radial direction from the crucible axis toward the crucible wall) produces a flat growth interface.

Curved growth interfaces, convex or concave, can lead to the appearance of crude macrosteps on the growth interface causing polytype instability and generation of defects. Accordingly, it is generally believed that a flat growth interface is the most conducive to the growth of high quality crystals, such as growing crystal 15.

Generally, the conventional PVT heating geometry shown in FIG. 1 creates an axisymmetric thermal field in crucible 11 with strong radial temperature gradients which are difficult to control.

Another problem of single-RF coil PVT heating shown in FIG. 1 is that it is difficult to scale up for the growth of larger-diameter crystals. With increase in the crucible diameter and the coil diameter, radial gradients become steeper, while electromagnetic coupling between the coil and crucible becomes less efficient.

A PVT sublimation growth technique called Axial Gradient Transport (AGT) is disclosed in U.S. Pat. No. 6,800,136 (hereinafter "the '136 patent") and has as its goal to reduce undesirable radial temperature gradients. A conceptual diagram of the AGT growth geometry from the '136 patent is shown in FIG. 2.

The AGT technique utilizes two independent flat heaters, namely, a source heater and a boule heater. The heaters can be either inductive or resistive. The heaters are positioned coaxially with the crucible, with the source heater disposed below the source material and the boule heater disposed above the growing crystal.

The AGT technique includes means for reducing heat flow in the radial direction, desirably to zero. This means includes cylindrical thermal insulation and an additional heater disposed around the AGT growth cell. A properly adjusted combination of the cylindrical thermal insulation and the heater can reduce radial heat losses to zero. The AGT geometry shown in FIG. 2 allegedly leads to strictly axial heat flow with essentially zero radial gradients.

The AGT apparatus utilizing inductive heating is described in detail in the '136 patent, which is incorporated herein by reference. This inductively heated AGT arrangement is shown in FIG. 3. It employs two flat RF coils, namely, top coil 30a and bottom coil 30b. The cylindrical crucible 31 including source material 32 and a seed crystal 33, upon which a growing crystal 35 grows, is disposed between these coils, whereby the top and bottom of the crucible serve as flat RF susceptors. Arrows 34 signify vapor transport in the growth crucible in the direction from source to crystal.

A disadvantage of the AGT cell design shown in FIG. 3 is related to the character of RF coupling between the flat coils 30a and 30b and the flat top and bottom of the crucible 31. There are two main types of flat RF coils, commonly known as "snail" and "snake" coils. When coupled to a disk-like susceptor, a "snail" coil will deposit its RF energy mostly at the susceptor edges due to skin-effect, as shown in FIG. 3. This type of coupling leads to poorly controllable radial temperature gradients in the crucible. "Snake" coils offer better uniformity of energy deposition, but their overall coupling efficiency is low.

An AGT apparatus utilizing flat resistive heaters is also disclosed in the '136 patent. At source material sublimation temperatures, radiation is the main mechanism of heat transfer from the heater to the crucible. Therefore, flat resistive heaters should be free from the disadvantages of flat RF coils.

A simple resistively heated AGT arrangement is shown in FIG. 4A. The cylindrical crucible 41 is placed between two flat resistive heaters 40a and 40b, which are shaped as disks with their diameters larger than that of the crucible. The upper heater 40a is disposed above a seed crystal 43, upon which a growing crystal 45 grows, while the lower heater 40b is disposed below source material 42. Arrows 44 denote the direction of vapor transport in the crucible.

The arrangement of FIG. 4A has the disadvantage that it creates negative radial gradients (concave isotherms) in the vicinity of the growing crystal. This is illustrated in FIG. 4B which shows the results of finite element simulation of the AGT cell shown in FIG. 4A. The strongly concave isotherms 46 are clearly visible. The root cause of these concave isotherms 46 is radial heat losses.

To some degree, concave isotherms 46 can be reduced by increasing the thickness of cylindrical thermal insulation around the AGT growth cell and/or by using additional cylindrical heater(s), as described above in connection with FIG. 2. However, this will make such AGT growth systems prohibitively large, complex, and expensive.

For SiC sublimation growth, graphite is a natural choice of heater material. In order to achieve the required temperature inside the growth crucible (up to 2400° C.), the heater temperature should be by 100-200° higher. Stability and reliability of graphite heaters at such high temperatures are poorly studied.

One particular problem of all resistive heaters operating at high temperatures in an inert gas atmosphere is the phenomenon of thermionic emission. At high temperatures, electron clouds form around the heater. Driven by the electric field created by electric current passing through the heater, these electrons migrate in the gas-filled space and contribute to the total current between the heater terminals. With increase in the heater voltage, the electrons can acquire enough energy for gas ionization. The produced gas ions can cause secondary (cascade) gas ionization leading to glow discharge.

Glow discharge alters the heating geometry and leads to the erosion of the graphite crucible, the heater, and the thermal insulation. Also, with the onset of glow discharge, the electric current across the heater becomes unstable, thus creating growth instabilities leading to stress and defects in the growing crystal.

Gas ions accelerated by the electric field bombard the heater surface and can cause secondary electron emission. This chain of surface bombardment and ionization events at high temperatures is called thermionic emission (glow discharge is, in fact, the first stage of thermionic emission). With further increase in the heater temperature and voltage, and with a sufficient supply of gas ions, glow discharge evolves into arc. Such arc can cause severe damage to the heater, crucible and power supply. Therefore, in order to realize the advantages of resistive heating in AGT growth of SiC crystals, glow discharge in the growth system is desirably avoided.

SUMMARY OF THE INVENTION

The present invention is an axial gradient transport crystal growth apparatus. The apparatus includes a crucible having a top, a bottom and a side that extends between the top of the crucible and a bottom of the crucible. The crucible is adapted to support a seed crystal at the top of an interior of the crucible and source material in the interior of the crucible in spaced relation between the seed crystal and the bottom of the crucible. The space between the source material and the bottom of the crucible defines a cavity in the interior of the crucible.

A first resistance heater is disposed in spaced relation above the top of the crucible. A second resistance heater has a first section disposed in spaced relation beneath the bottom of the crucible and a second section disposed in spaced relation around the outside of the side of the crucible.

The first and second resistance heaters can be operative for growing on the seed crystal disposed at the top of an interior of the crucible a growth crystal having a convex growth interface, wherein a ratio of a radius of curvature of the convex growth interface over a diameter of the grown crystal is between about 2 and about 4.

The top and bottom of the crucible can be round. The first resistance heater can be disk-shaped. The first section of the second resistance heater can be disk-shaped.

The first heater and the first section of the second resistance heater can have outer diameters that are between 110% and 130%, inclusive, of the outer diameter of the respective top and bottom of the crucible.

The first resistance heater and the first section of the second resistance heater can have central holes with a diameter between 25% and 75% of a diameter of the crucible.

The side of the crucible and the second section of the second resistance heater can be cylindrical-shaped.

The top of the second section of the second resistance heater can be disposed at a position between 50% and 75% of the height of the crucible.

The inner diameter of the second section of the second resistance heater can be spaced from the exterior of the crucible by a radial distance between 10 mm and 25 mm.

The cavity inside the crucible between the source material and the bottom of the crucible can have a height-to-diameter ratio between 0.2 and 1.

The invention is also an axial gradient growth method. The method includes: (a) providing a crucible having a top, a bottom and a side that extends between the top of the crucible and a bottom of the crucible, a first resistance heater disposed in spaced relation above the top of the crucible, and a second resistance heater having a first resistive section disposed in spaced relation beneath the bottom of the crucible and a second resistive section disposed in spaced relation around the outside or exterior of the side of the crucible; (b) providing a seed crystal at the top of an interior of the crucible and a source material in the interior of the crucible in spaced relation between the seed crystal and the bottom of the crucible; (c) applying electrical power to the first and second resistance heaters of a sufficient extent to create in the interior of the crucible a temperature gradient of sufficient temperature to cause the source material to sublimate and condense on the seed crystal thereby forming a growth crystal; and (d) maintaining the electrical power to the first and second resistance heaters until the growth crystal has grown to a desired size.

The first resistance heater can receive between 10% and 30% of the electrical power. The second resistance heater can receive between 70% and 90% of the electrical power.

The voltage applied to each heater is desirably less than 30 VAC RMS and more desirably less than 25 VAC RMS.

An interior and an exterior of the crucible and the heaters are in the presence of between 1 Torr and 40 Torr of an inert gas during the growing of the growth crystal. The inert gas can be helium.

Step (c) can include controlling the electrical power applied to the first and second resistance heaters in a manner to cause a growth crystal to grow on the seed crystal, wherein the grown growth crystal has a convex growth interface, wherein a ratio of a radius of curvature of the convex growth interface over a diameter of the grown growth crystal is between about 2 and about 4.

BRIEF DESCRIPTION OF THE DRAWINGS

FIG. 3 is a schematic diagram of the prior art AGT growth cell of FIG. 2;

FIG. 4A is a schematic diagram of a resistively heated prior art AGT growth cell;

FIG. 4B is a graph of isotherms that would be realized in the interior of the resistively heated prior art AGT growth cell of FIG. 4A during use;

DETAILED DESCRIPTION OF THE INVENTION

The present invention is an AGT growth apparatus and process, including the geometry of the heaters, as well as measures for the reduction or elimination of glow discharge in the growth chamber. The AGT growth process described herein has a growth interface which is slightly convex toward the crucible bottom. This slightly convex growth interface can yield large SiC single crystals of 6H and 4H polytypes suitable for the manufacturing of high quality SiC substrates of 3 inches and 100 mm in diameter.

Herein, when temperature gradients inside of the crucible increase in the radial direction from the crucible axis toward the crucible wall, such radial temperature gradients are known as positive radial temperature gradients. Isotherms of positive radial temperature gradients inside of the crucible are convex toward the crucible bottom (i.e., toward source material 13). In contrast, when temperature gradients inside of the crucible decrease in the radial direction from the crucible axis toward the crucible wall, such radial temperature gradients are known as negative radial temperature gradients. Isotherms of negative radial temperature gradients inside of the crucible are concave toward the crucible bottom. Lastly, when temperature gradients inside of the crucible do not change in the radial direction from the crucible axis toward the crucible wall, such radial temperature gradients are known as zero radial temperature gradients. Isotherms of zero radial temperature gradients inside of the crucible are flat and perpendicular to the crucible axis.

Figures 1, 2:
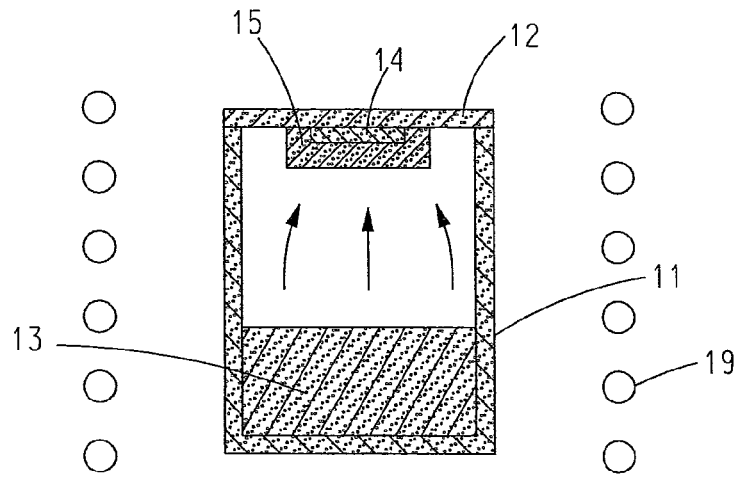
FIG. 1 is schematic diagram of a prior art physical vapor transport sublimation growth cell.
FIG. 2 is a conceptual diagram of a prior art axial gradient transport (AGT) apparatus.
Figure 5:
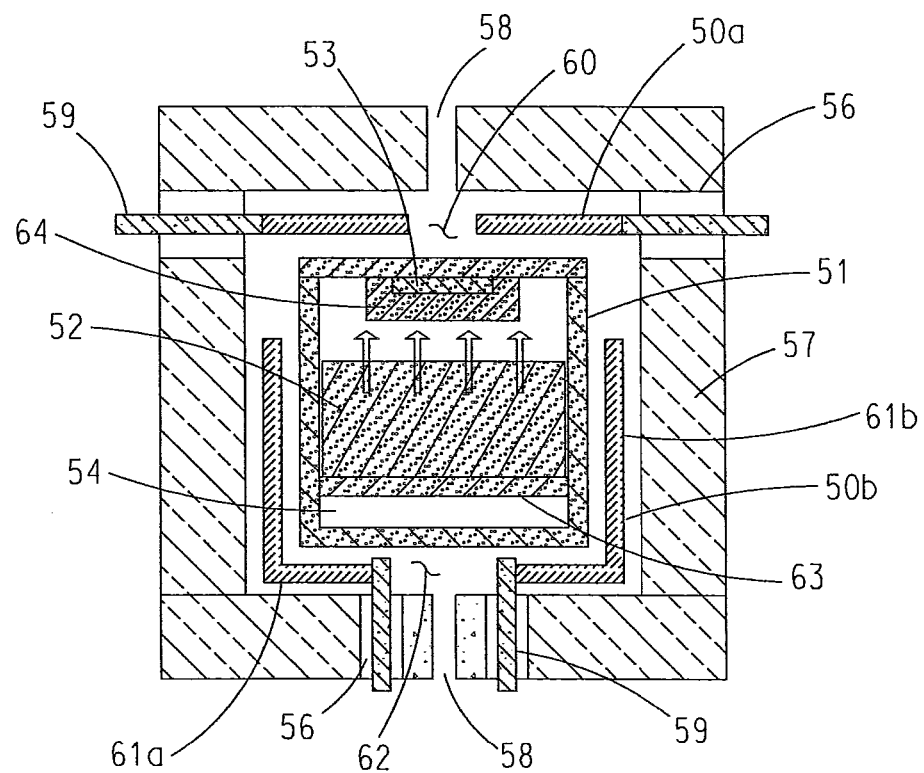
FIG. 5 is a schematic diagram of a resistively heated AGT growth apparatus in accordance with the present invention.

With reference to FIG. 5, a resistively heated AGT growth apparatus in accordance with the present invention includes a cylindrical growth crucible 51, having therein an SiC source material 52 and an SiC seed crystal 53. Growth crucible 51 is positioned between two resistive heaters, which are disposed coaxially with growth crucible 51. These heaters include top heater 50a and bottom heater 50b. Growth crucible 51 and heaters 50a and 50b are surrounded by thermal insulation 57 made of light-weight fibrous graphite. Electric power is provided to heaters 50a and 50b via graphite extension electrodes 59 which extend through widows 56 in thermal insulation 57. Desirably, growth crucible 51, heaters 50a and 50b, and thermal insulation 57 are disposed in a larger container (not shown) that can maintain crucible 51, heaters 50a and 50b, and thermal insulation 57 at a suitable pressure (discussed hereinafter) during the growth of a growing crystal 64 on seed crystal 53.

Top heater 50a is disk-shaped with a central hole 60. The outer diameter of top heater 50a is larger than that of growth crucible 51. Desirably, the outer diameter of top heater 50a is between 110% and 130% the diameter of growth crucible 51. The inner diameter of top heater 50a (i.e., the diameter of central hole 60) is smaller than that of growth crucible 51. Desirably, the inner diameter of top heater 50a is between 25% and 75% the diameter of growth crucible 51. Top heater 50a is disposed above growth crucible 51 at a distance from growth crucible 51 desirably between 10% and 30% the diameter of crucible 51.

Bottom heater 50b is cup-shaped. More specifically, bottom heater 50b comprises two heating sections: namely, a first, flat or disk-shaped section 61a and a second, cylindrically-shaped section 61b. Bottom heater 50b is disposed below and around source material 52 in growth crucible 51. Flat section 61a of bottom heater 50b has a central hole 62 with a diameter smaller than that of growth crucible 51. Desirably, the diameter of central hole 62 of bottom heater 50b is between 25% and 75% of the diameter of growth crucible 51. The flat section of bottom heater 50b is desirably disposed a distance from growth crucible 51 between 10% and 30% of the diameter of crucible 51. The cylindrical section 61b of the bottom heater 50b surrounds the side of growth crucible 51. Desirably, the height of cylindrical section 61b is between 50% and 75% of the height of growth crucible 51. Desirably, the inner diameter of cylindrical section 61b is spaced from the outer diameter of growth crucible 51 by a radial distance between 10 mm and 25 mm.

Desirably, source material 52 is disposed on a structure 63 a distance from the bottom of crucible 51 to create an empty space or cavity 54 between source material 52 and the bottom of crucible 51, wherein all of the source material is spaced from the bottom of the crucible by a gap between all of the source material and the bottom of the crucible. Structure 63 can be made of any suitable and/or desirable material, such as, without limitation, light-weight fibrous graphite. Desirably, cavity 54 has the height-to-diameter aspect ratio between 0.2 and 1.

Pyrometric windows 58 can be formed in the top and bottom parts of thermal insulation 57 for measuring the temperature of crucible 51 via a pyrometer.

Figure 6A:
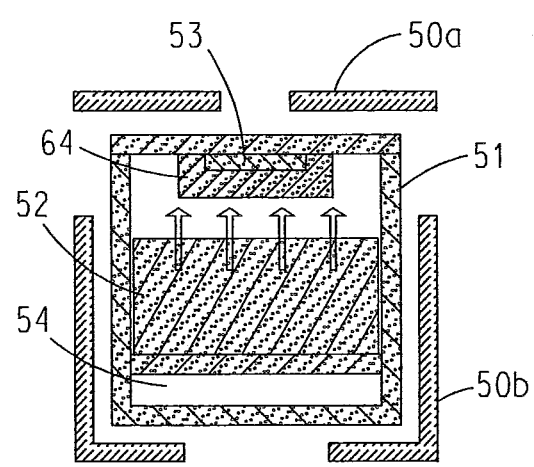
FIG. 6A a schematic diagram of the resistively heated AGT growth cell of FIG. 5.
Figure 6B:
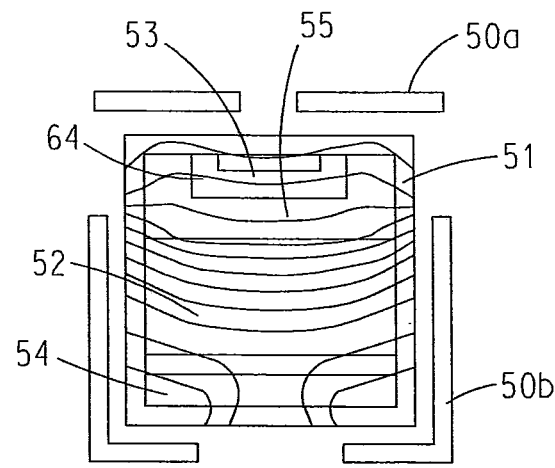
FIG. 6B is a graph of isotherms that would be realized in the interior of the resistively heated AGT growth cell of FIG. 6A during use.

A portion of the resistively heated AGT growth cell of FIG. 5 is shown in isolation in FIG. 6A. The result of a thermal simulation on the portion of the resistively heated AGT growth cell shown in FIG. 6A is shown in FIG. 6B. The reference numbers in FIGS. 6A and 6B are the same as in FIG. 5. The heating geometry of the AGT growth cell shown in FIG. 5 creates isotherms 55 in the vicinity of growing crystal 64 which are slightly convex towards the bottom of the crucible.

The AGT heating geometry shown in FIG. 5 has the following advantages: (i) the radial temperature gradients in the vicinity of growing crystal 64 are slightly positive (i.e., slightly convex toward the bottom of growth crucible 51), which helps avoid a concave growth interface toward the bottom of growth crucible 51 or a flat growth interface; and (ii) the radial temperature gradients in growing crystal 64 are relatively small, which helps to avoid stress and cracking in growing crystal 64.

An advantage of the AGT heating geometry shown in FIG. 5 is that it creates relatively small and positive radial temperature gradients in the vicinity of growing SiC crystal 64. Such gradients avoid or eliminate multiple growth centers, crude macrosteps, polytype instability, and associated defects in growing crystal 64.

The AGT growth apparatus and growth process of FIG. 5 yield SiC crystals having a convex growth interface. For SiC crystal boules capable of yielding 3" substrates, the radius of interface curvature is desirably between 15 cm and 30 cm. For large-diameter SiC boules capable of yielding 100 mm substrates, the radius of interface curvature is desirably between 20 cm and 40 cm. For each diameter boule, the ratio of curvature of the convex growth interface radius over diameter is between about 2 and about 4, e.g., 20 cm/100 mm=2; and 40 cm/100 mm=4.

In the AGT growth cell shown in FIG. 5, bottom heater 50b is the main heater supplying approximately 80% of the required power, while top heater 50a supplies approximately 20% of power. The purpose of top heater 50a is to create a desired temperature distribution in the upper part of growth crucible 51. Fine tuning of the thermal gradients in the upper part of the growth crucible 51 can be achieved by further adjustment of the shape of the upper heater 50a, for instance, by changing the diameter of the central hole 60a.

In a prior art PVT arrangement, single-coil RF heating created conditions wherein the cylindrical wall of the crucible serving as an RF susceptor was hotter than the crucible bottom. This lead to the deposition of polycrystalline SiC on the bottom of the crucible and poor utilization of the source material.

In the growth cell shown in FIG. 5, both the cup-like shape of bottom heater 50b and cavity 54 disposed under source material 52 serve to eliminate this shortcoming. Due to the radiative character of heat transport, the high emissivity of graphite ($\alpha$=0.95–0.98), and the aforementioned height-to-diameter aspect ratio of cavity 54 of 0.2 to 1.0, the temperature distribution inside cavity 54 is spatially uniform, i.e., with low temperature gradients. Accordingly, the spacing between the isotherms inside cavity 54 in FIG. 6B is large.

The presence of cavity 54 under source material 52 helps to increase the temperature at the bottom of the source material 52 and crucible 51. As a result, the deposition of polycrystalline SiC on the crucible bottom is avoided or eliminated and the utilization of source material 52 is improved.

Figure 7:
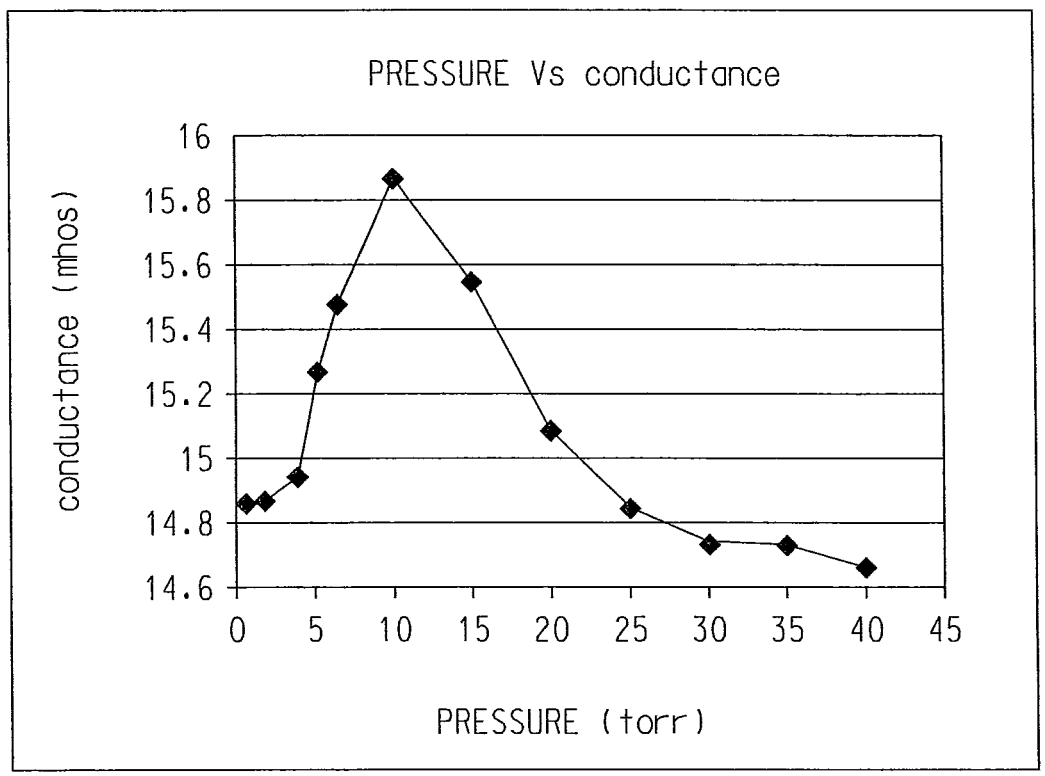
FIG. 7 is a graph of electrical conductance versus gas (helium) pressure for the graphite heaters of the resistively heated AGT growth apparatus of FIG. 5.

The onset of glow discharge in a resistively heated system depends on the gas nature, its pressure and heater voltage, but does not depend on the material of the heater, provided that a sufficiently high temperature is reached. FIG. 7 shows the dependence of the electrical conductance of a graphite heater on inert gas (helium) pressure at a resistive heater voltage of 25 VAC RMS and temperature of 2200° C. The sharp increase in the heater conductance at pressures between 0.1 and 40 Torr reflects the contribution of glow discharge (thermionic emission) to the total electric current flowing between the heater terminals.

The explanation for this phenomenon is as follows. At a low gas pressure there is a low concentration of gas ions, and the additional electronic/ionic current is small. With increase in the gas pressure the electric current increases due to thermionic emission, and the measured conductance of the heater increases. With further increase in gas pressure, scattering and energy dissipation by the gas atoms quench the emission leading to a decrease in the measured heater conductance.

The pressure range and magnitude of thermionic emission depends on the nature of the inert gas used. With heavy gases having low ionization potential, such as argon, thermionic emission starts at lower voltages, reaches higher amplitudes and readily progresses into arc. With light gases having high ionization potential, such as helium, thermionic emission starts at higher voltages and its amplitude is lower. Helium is a light gas which has the highest ionization potential among inert gases. Therefore, helium represents the best choice for resistively heated SiC crystal growth systems.

Another factor to prevent thermionic emission is the heater geometry. Glow discharge starts in areas of a heater where the temperature and electric field strength are the highest. Therefore, the design of the AGT heater of the present invention desirably avoids closely spaced terminals (extension electrodes), which are under highest potential difference.

Resistively heated AGT systems in accordance with the present invention, utilized for the growth of industrial size SiC crystals, have shown that SiC crystal growth can be successfully carried out in helium without glow discharge. Desirably, the He pressure is above 25 Torr and, more desirably, above 30 Torr; and the voltage applied to the heater desirably does not exceed 30 VAC RMS and, more desirably, does not exceed 25 VAC RMS.

The aforementioned limitation to the heater voltage determines the heater resistance. An example of a practical calculation is given below. Assume that heat losses in the AGT growth apparatus require 15 kW of power to achieve and maintain the desired SiC growth temperature. This means that the bottom heater should produce about 12 kW of power, while the top heater should produce about 3 kW. Assume further that in order to prevent glow discharge, the bottom heater voltage is limited to 20 VAC RMS and the top heater voltage is limited to 12 VAC RMS. Then, the resistance of the lower heater should be about 0.03 Ohm, and the resistance of the top heater should be about 0.05 Ohm. The electric current in the heaters will be about 660 A RMS in the bottom heater 50b and about 240 A RMS in the top heater 50a.

Figure 8:
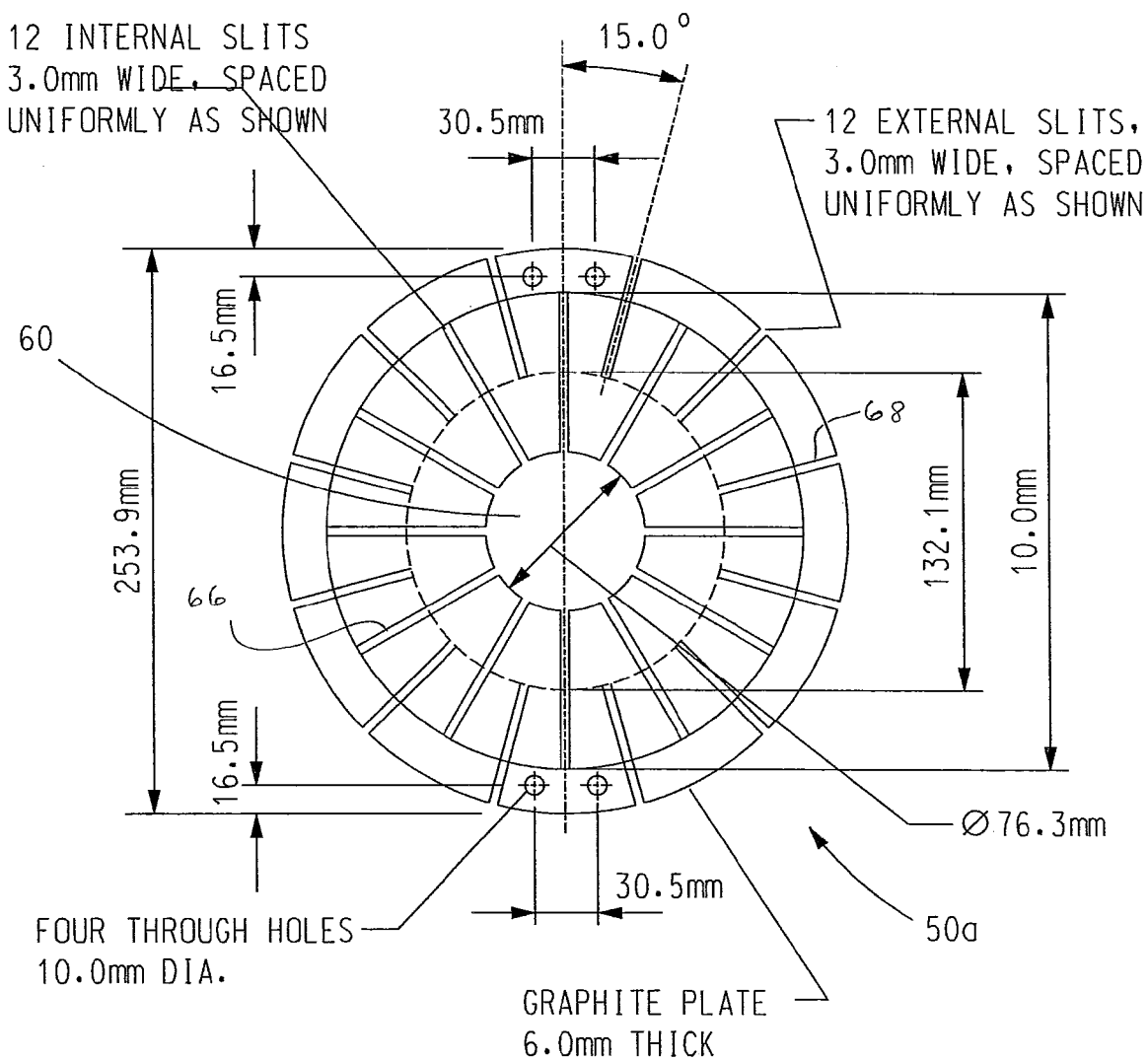
FIG. 8 is plan view of the top heater of the resistively heated AGT growth apparatus of FIG. 5.
Figure 9A:
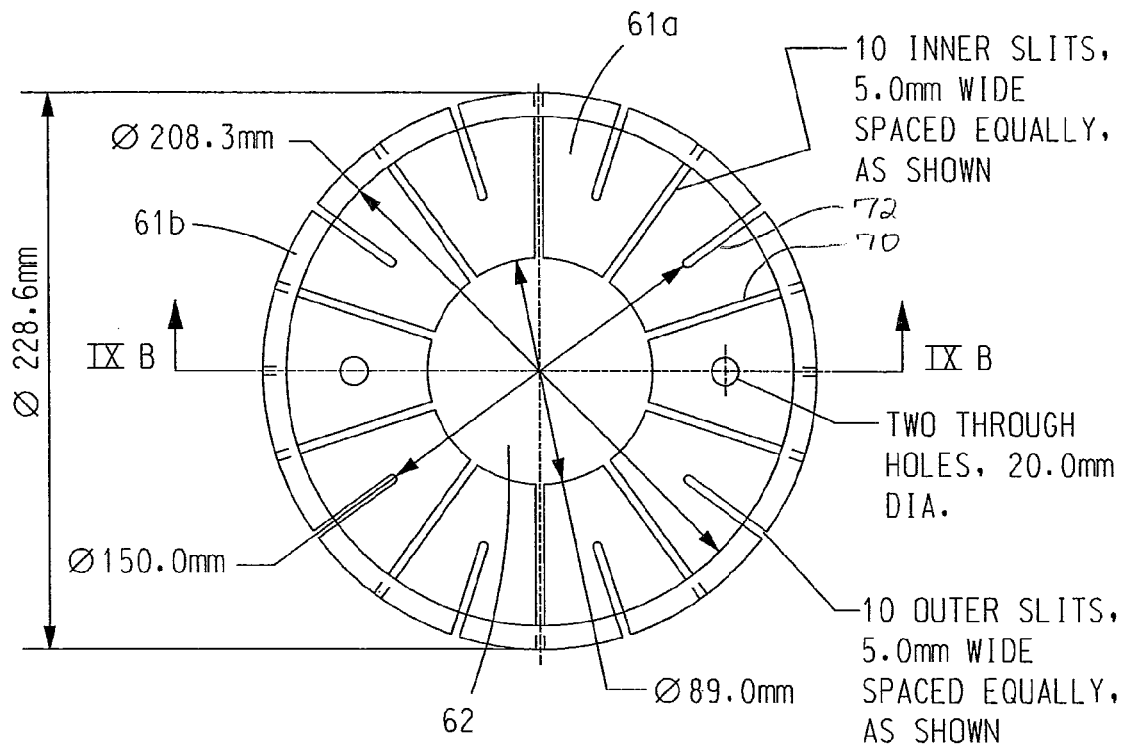
FIG. 9A is plan view of the bottom heater of the resistively heated AGT growth apparatus of FIG. 5.
Figure 9B:
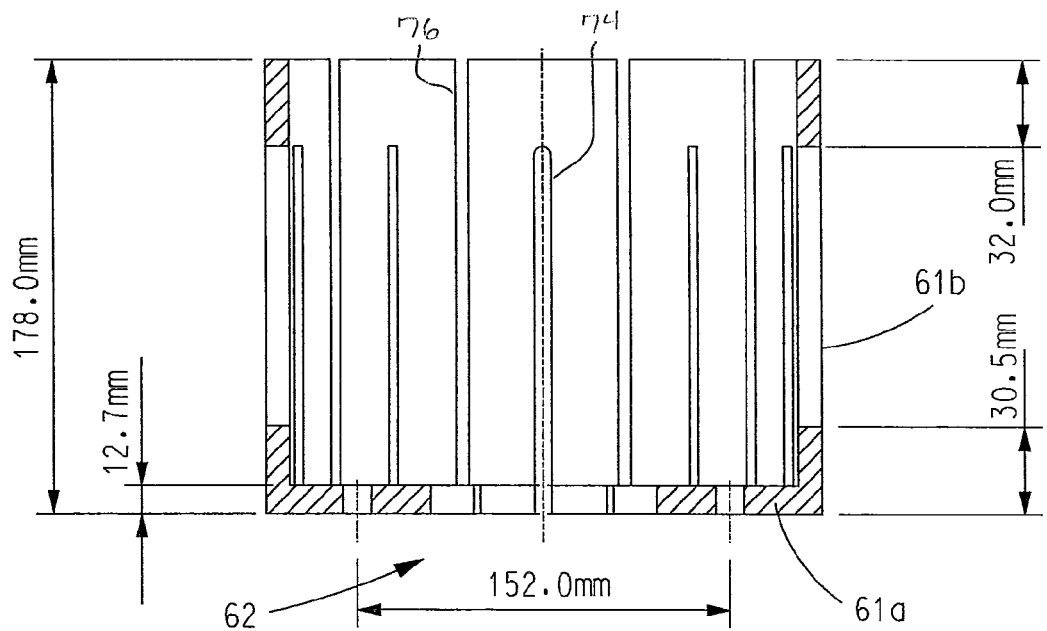
FIG. 9B is a sectional view taken along line IXB-IXB of FIG. 9A.

Exemplary dimensions of an exemplary top heater 50a satisfying the above requirements are shown in FIG. 8. Exemplary dimensions of an exemplary bottom heater 50b satisfying the above requirements is shown in FIGS. 9A and 9B. The graphite material for heaters 50a and 50b is desirably isostatically molded, fine-grain graphite of a density, desirably, between 1.73 and 1.82 g/cm$^3$ and resistivity, desirably, between 9 and 14 µOhm-meter at room temperature.

Exemplary top heater 50a shown in FIG. 8 includes a plurality of internal slits (or slots) 66, each of which extends radially outward from central hole 60 and terminates intermediate central hole 60 and the circumference of top heater 50a. Top heater 50a also includes a plurality of external slits (or slots) 68, each of which extends radially inward from the circumference of top heater 50a and terminates intermediate central hole 60 and the circumference of top heater 50a. Desirably, internal slits 66 and external slits 68 are dispersed uniformly around the circumference of top heater 50a in an interdigitated pattern, whereupon a portion of each slit 66 resides between a pair of slits 68, and a portion of each slit 68 resides between a pair of slits 66. Exemplary top heater 50*a* includes twelve slits 66 and twelve slits 68. However, this is not to be construed as limiting the invention.

Exemplary flat or disk-shaped section 61*a* of exemplary bottom heater 50*b* shown in FIG. 9A includes a plurality of internal slits (or slots) 70, each of which extends radially outward from central hole 62 and terminates intermediate central hole 62 and the circumference of disk-shaped section 61*a*. Disk-shaped section 61*a* also includes a plurality of external slits (or slots) 72, each of which extends radially inward from the circumference of top heater 50*a* and terminates intermediate central hole 62 and the circumference of top heater 50*a*. Desirably, internal slits 70 and external slits 72 are dispersed uniformly around the circumference of disk-shaped section 61*a* in an interdigitated pattern, whereupon a portion of each slit 70 resides between a pair of slits 72, and a portion of each slit 72 resides between a pair of slits 70. Exemplary disk-shaped section 61*a* includes ten slits 70 and ten slits 72. However, this is not to be construed as limiting the invention.

Exemplary cylindrically-shaped section 61*b* of exemplary bottom heater 50*b* shown in FIG. 9B includes a plurality of upwardly extending slits (or slots) 74, each of which extends upward from disk-shaped section 61*a* and terminates before the top edge of cylindrically-shaped section 61*b*. Cylindrically-shaped section 61*b* also includes a plurality of slits (or slots) 76, each of which extends downward from the top edge of cylindrically-shaped section 61*b* and either terminates before disk-shaped section 61*a* or extends completely to disk-shaped section 61*a*. However, this is not to be construed as limiting the invention.

The foregoing descriptions of the slits of top heater 50*a*, disk-shaped section 61*a*, and cylindrically-shaped section 61*b* are not to be construed as limiting the invention since it is envisioned that each of top heater 50*a*, disk-shaped section 61*a*, and cylindrically-shaped section 61*b* can have any suitable and/or desirable arrangement of slits.

Advantages of the Present Invention Include:

An Axial Gradient Transport (AGT) crystal growth process and apparatus for the sublimation growth of SiC single crystals which includes a cylindrical growth crucible for supporting the SiC source material and the SiC seed in said crucible in spaced relation. The AGT growth apparatus includes two resistive heaters, one top heater and one bottom heater, disposed coaxially with the cylindrical growth crucible. The top heater is disposed above the growing crystal and the bottom heater is disposed around and below the source material. The top heater is disk-shaped with a central hole. The bottom heater is cup-shaped having two heating sections—one flat and one cylindrical. The top and bottom heaters are made of graphite.

The disk-shaped top heater has an outer diameter that is desirably between 10% and 30% larger than the crucible diameter and an inner (hole) diameter desirably between 25% and 75% of the diameter of the crucible. The top heater is disposed above the growth crucible at a distance from the crucible desirably between 10% and 30% of the crucible diameter.

The cup-shaped bottom heater includes a flat section which is disposed at a distance from the crucible desirably between 10% and 30% of the crucible diameter. The flat section has a central hole with a diameter desirably between 25% and 75% of the crucible diameter. The cylindrical section has a height desirably between 50% and 75% of the crucible height. The cylindrical section has an inner diameter desirably between 10 mm and 25 mm larger than the crucible outer diameter.

The heaters are desirably made of isostatically molded, fine-grain graphite of a density desirably between 1.73 and 1.82 g/cm$^3$ and resistivity desirably between 9 and 14 μOhm-meters at room temperature.

The growth crucible desirably includes a cavity separating the source material from the crucible bottom. The cavity has a height-to-diameter aspect ratio desirably between 0.2 and 1.0.

The AGT crystal growth process utilizes one top and one bottom heater. The bottom heater desirably provides between 70% and 90% of the electrical power required to heat the growth crucible to the required sublimation growth temperatures. The top heater desirably provides between 10% and 30% of the electrical power required to heat the growth crucible to the required sublimation growth temperatures. The top heater defines a thermal field in the upper portion of the growth crucible characterized by low and positive radial temperature gradients to produce flat or slightly convex isotherms. The voltage applied to the heaters desirably does not exceed 30 VAC RMS and, more desirably, does not exceed 25 VAC RMS.

The AGT crystal growth process desirably occurs in an atmosphere of inert gas, such as, without limitation, helium, at a pressure desirably above 25 Torr and, more desirably, above 30 Torr.

Technical Advantage of the Invention:

Application of the invention to sublimation growth of silicon carbide yields SiC single crystals of high quality and low thermal stress.

The invention has been reduced to practice in several SiC growth runs. These runs yielded large-diameter, high-quality, semi-insulating 6H and n$^+$ 4H crystals, as described below.

A schematic diagram of the resistively-heated AGT growth apparatus used in these runs is shown in FIG. 5. The heating assembly comprised two resistive heaters similar to those shown in FIGS. 8, 9A and 9B. That is, the bottom heater was cup-shaped, while the top heater was disk-shaped. The central holes in the heaters were 50 mm in diameter for the top heater and 75 mm in diameter for the bottom heater. The axial distances between each heater and the crucible were about 25 mm. The radial distance between the outside surface of the crucible and the inner surface of the portion of the bottom heater that surround the side of the crucible was 12 mm.

The heaters were made of dense, low-porosity graphite with a density of 1.75 g/cm$^3$. The resistance of the heaters was 0.03 Ohm for the top heater and 0.05 Ohm for the bottom heater (measured at room temperature). During a growth cycle, the bottom heater produced 80% of the required power, while the top heater produced 20% of the required power. The voltage on the terminals of either heater did not exceed 20 VAC RMS.

All of the growth runs occurred in the presence of helium at a pressure of 40 Torr. Because the crucible is made from a porous graphite, the pressure of the helium inside the crucible, as well as outside the crucible and around the heaters, was approximately the same, i.e., 40 Torr. During growth, the source and seed temperatures were maintained at 2180° C. and 2130° C., respectively.

Figure 10A:
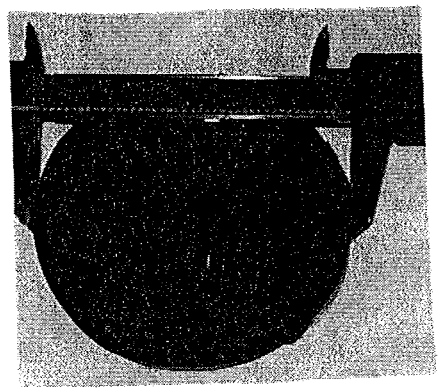
FIGS. 10A, 10B and 10C are photographs of 100 mm SiC boules of polytype 6H SI, 6H SI and 4H n$^+$, respectively, grown in the AGT growth apparatus of FIG. 5.
Figure 10B:
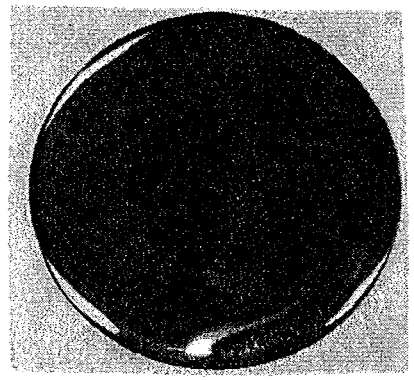
Figure 10C:
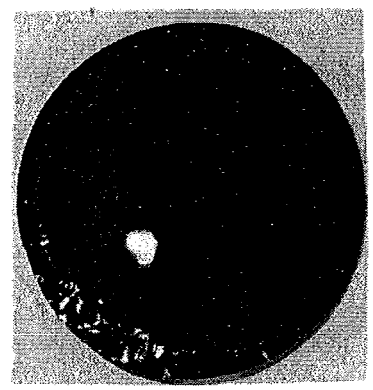

FIGS. 10A, 10B and 10C are photographs of some SiC boules grown using the resistively-heated AGT growth apparatus shown in FIG. 5 that reached 100 mm in diameter. FIG. 10A is a photograph of a 6H SI boule number DC0020; FIG. 10B is a photograph of a 6H SI boule number DE0001; and FIG. 10C is photograph of a 4H n$^+$ boule number DF0001. All SiC crystal boules grown in the improved AGT growth process and apparatus, including 3" and 100 mm boules, exhibited a slightly convex growth interface with the radius of curvature between 25 and 35 cm. The grown crystals shown in FIGS. 10A, 10B and 10C were successfully processed into wafers, including 3 inch diameter wafers and 100 mm diameter wafers.

Figure 11A:
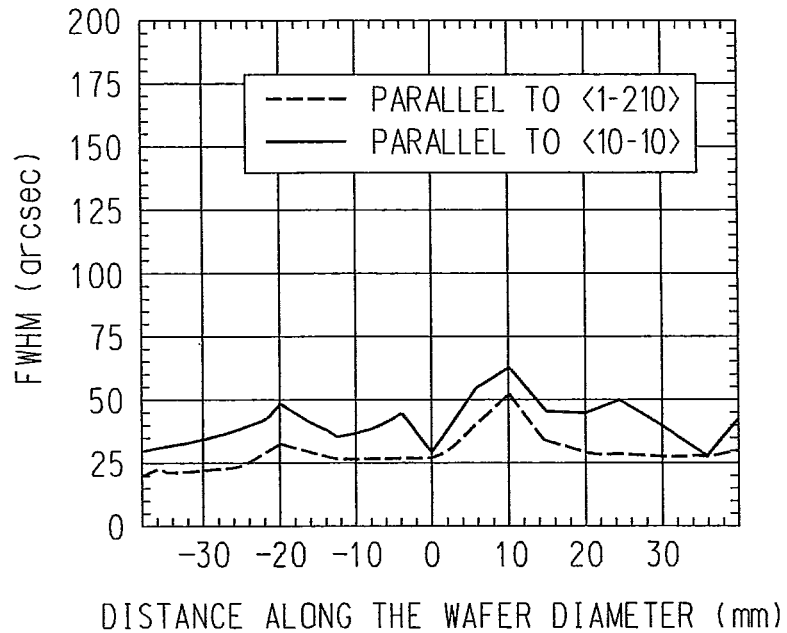
FIGS. 11A and 11B are x-ray diffraction graphs of the boules of FIGS. 10B and 10C, respectively, obtained from scans performed along the <1-210> and <10-10> axes.

FIG. 11A shows graphs of x-ray rocking curve scans performed on the <1-210> and <10-10> axes of the 6H crystal boule (DE0001) shown in FIG. 10B. The Full Width and Half Maximum (FWHM) of the x-ray reflection serves as a good measure of crystal quality: the narrower the reflection and the lower the FWHM value, the better is the crystal quality. To compare, the best quality 6H SiC Lely platelets measured yielded FWHM values between 20 and 40 arc-seconds. The FWHM of typical PVT-grown bulk SiC boules is usually higher—between 40 and 100 arc-seconds. As can be see in FIG. 10A, the FWHM values for the crystal DE0001 are between 25 and 60 arc-seconds. Such low FWHM values testify to the excellent crystal quality.

Figure 11B:
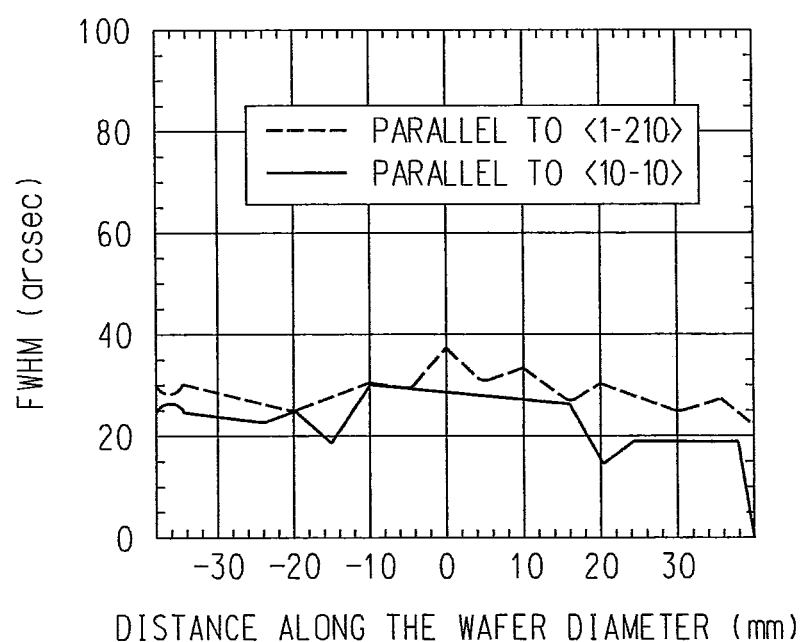

FIG. 11B shows graphs of x-ray rocking curve scans on performed on the <1-210> and <10-10> axes of the 4H crystal boule (DF0001) shown in FIG. 10C. The measurement conditions were the same as in the case above. The values of FWHM measured on this 4H crystal boule were even lower, between 18 and 40 arc-seconds. Thus, for this boule as well, the x-ray analysis revealed excellent crystal quality.

Figure 12A:
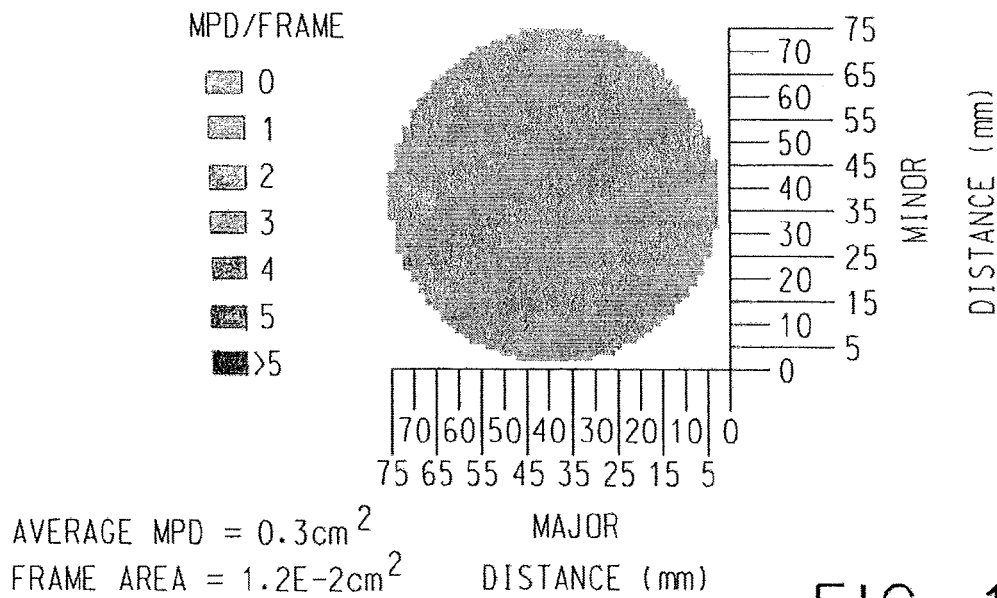
FIGS. 12A and 12B are micropipe density maps of the boules of FIGS. 10B and 10C, respectively.
Figure 12B:
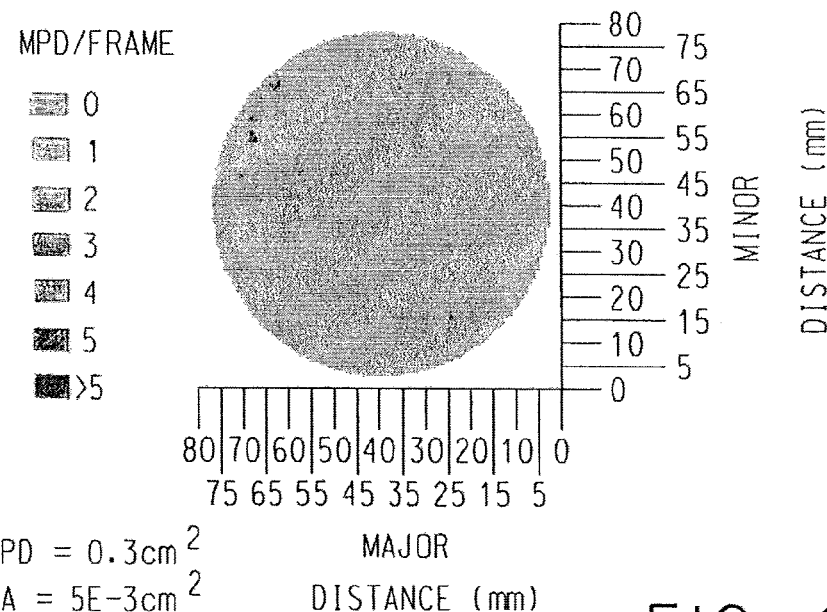

Another measure of crystal quality is its micropipe density (MPD). Micropipes are harmful defects causing device failure, and the majority of device applications require low MPD values in the SiC substrate. While SiC substrates with zero MPD are gradually becoming available commercially, the current state of the art across the entire industry is on the order of 5 to 40 micropipes-$cm^{-2}$. FIGS. 12A and 12B show MPD maps measured on the AGT-grown crystals DE0001 and DF0001 of FIGS. 10B and 10C, respectively. Both crystals show average MPD below 0.5 micropipes-$cm^{-2}$, with boule DE0001 (FIG. 11A) being practically micropipe-free.

The invention has been described with reference to the preferred embodiment. Obvious modifications and alterations will occur to those skilled in the art upon reading and understanding the preceding detailed description. It is intended that the invention be construed as including all such modifications and alterations insofar as they come within the scope of the appended claims or the equivalents thereof.

The invention claimed is:

1. An axial gradient growth method comprising:
    (a) providing a crucible having a top, a bottom and a side that extends between the top of the crucible and a bottom of the crucible, a first resistance heater disposed in spaced relation above the top of the crucible, and a second, cup-shaped resistance heater having a first resistive section disposed in spaced relation beneath the bottom of the crucible and a second resistive section that extends from the first resistive section in a direction toward the first resistance heater and terminates intermediate the top and the bottom of the crucible in spaced relation around the outside of the side of the crucible;
    (b) providing a seed crystal at the top of an interior of the crucible and a source material in the interior of the crucible in spaced relation between the seed crystal and the bottom of the crucible and in contact with the side of the crucible, wherein all of the source material is spaced from the bottom of the crucible by a gap between all of the source material and the bottom of the crucible;
    (c) applying electrical power to the first and second resistance heaters of a sufficient extent to create in the interior of the crucible a temperature gradient of sufficient temperature to cause the source material to sublimate and condense on the seed crystal thereby forming a growth crystal; and
    (d) maintaining the electrical power to the first and second resistance heaters until the growth crystal has grown to a desired size.

2. The method of claim 1, wherein:
    the first resistance heater receives between 10% and 30% of the electrical power; and
    the second resistance heater receives between 70% and 90% of the electrical power.

3. The method of claim 1, wherein a voltage applied to each heater is less than 30 VAC RMS.

4. The method of claim 3, wherein a voltage applied to each heater is less than 25 VAC RMS.

5. The method of claim 1, wherein an interior and an exterior of the crucible and the heaters are in the presence of between 1 Torr and 40 Torr of an inert gas during the growing of the growth crystal.

6. The method of claim 1, wherein step (c) includes controlling the electrical power applied to the first and second resistance heaters to cause a growth crystal to grow on the seed crystal, wherein the grown growth crystal has a convex growth interface, wherein a ratio of a radius of curvature of the convex growth interface over a diameter of the grown growth crystal is between about 2 and about 4.

7. The method of claim 1, wherein a height of the second resistive section is between 50% and 75% of a height of the crucible.

* * * * *